United States Patent [19]
Whitson et al.

[11] Patent Number: 5,464,461
[45] Date of Patent: Nov. 7, 1995

[54] FILTER FOR MOUNTING ON AN AVIONIC LINE REPLACEABLE UNIT

[75] Inventors: Frederick A. Whitson, Oconomowoc; William K. Siebert, West Bend; Kenneth B. Raihala, Racine, all of Wis.

[73] Assignee: Electronic Cable Specialists, Inc., Franklin, Wis.

[21] Appl. No.: 160,681

[22] Filed: Dec. 1, 1993

[51] Int. Cl.$^6$ ................................................ B01D 46/10

[52] U.S. Cl. ........................ 55/480; 55/493; 55/501; 55/502; 55/503; 55/504; 55/505; 55/516; 55/517

[58] Field of Search .................. 55/480, 481, 493, 55/497, 499, 501, 502, 503, 504, 505, 508, 510, 511, 516, 517, DIG. 31

[56] References Cited

U.S. PATENT DOCUMENTS 4,549,887  10/1985  Joannou ............................. 55/493 X
4,713,099  12/1987  Schroeder ........................... 55/493 X
5,176,570  1/1993   Liedl ................................... 55/481 X

*Primary Examiner*—Charles Hart
*Attorney, Agent, or Firm*—Ryan, Kees & Hohenfeldt

[57] ABSTRACT

A filter assembly for a coolant air stream flowing through an LRU box has a base frame with a large opening superimposed on the perforated top surface of the box. A filter element is superimposed over the opening and a cover having a large opening is hinged to the base frame and latched thereto with its opening aligned with the other opening. The filter assembly is clamped by means of a harness to the LRU box with a clamping band that wraps around one end of the LRU box and one end portion of the base frame simultaneously. Spring tensioned cable sections attach to the band and extend diagonally along the sides of the LRU box and then through eyelets on the opposite end portion of the base frame so the cable develops a vertical component of force for clamping the assembly to the LRU box.

4 Claims, 6 Drawing Sheets

5,464,461

FILTER FOR MOUNTING ON AN AVIONIC LINE REPLACEABLE UNIT

BACKGROUND OF THE INVENTION

The invention disclosed herein pertains to a filter assembly for filtering coolant air that passes through an avionic line replaceable unit (LRU) box. The invention is an improvement over copending application Ser. No. 08/033,158, filed Mar. 16, 1993. The copending application is assigned to the assignee of the present application.

In aircraft, electronic and electrical circuitry is customarily contained in LRUs which are essentially boxes that have air inlet and outlet holes on their top and bottom surfaces. The LRUs are installed in trays whose dimensions and configurations are standardized in accordance with the requirements of the avionic industry. Multiple circuit electrical connectors are typically mounted in the rear part of the tray and mating electrical connectors are mounted on the rear of the LRUs so that when the LRU is slid into the tray, the mating connectors join and a plurality of electrical circuits are completed. The bottom or base of the tray is generally planar and has a large opening, typically, for communicating the air passing into or out of the LRU with a shelf constituting a plenum whose interior is at negative pressure relative to atmospheric pressure. An opening in the base of the tray has a gasket that effects a seal with the bottom of the LRU box and with the underlying plenum shelf. The opening in the plenum shelf is typically subdivided into a plurality of openings which can be selectively plugged or sealed to accomplish what is called metering of the air flow through the LRU box. In dedicated designs use a fixed number of metering holes their total cross-section to provide the air flow volume required in a particular LRU.

In existing aircraft, the customary practice is to maintain the plenum or shelf interior at negative pressure such that coolant air enters or is drawn in through the top holes of the LRU box and exits or is drawn out through the holes in the bottom of the box. This air is conducted away and possibly discharged to the atmosphere through a conduit in which there is a suction or pressurizing fan that maintains a desired negative pressure condition in the plenum.

The LRUs are mounted in avionic trays in various compartments of the aircraft such as in a compartment beneath the pilot's cabin or in a compartment located above or below the passenger cabin. The cooling air for the LRUs is drawn into compartments of the aircraft by various means including ventilation systems, ventilation ports, doors, hatches and the like and is discharged either into the compartment or elsewhere by way of the plenum or shelf air conduit. Avionic trays may be installed in compartments which are in air circulation communication with the passenger compartment, the baggage compartment and other subcabin compartments wherein the air may contain various contaminants such as smoke, grease, aerosols, insects, hair and other organic matter in aircraft which carry live animals, for example. These contaminants are entrained in the coolant air that is either forced through or drawn through the LRUs. The result is that the electronic components in the LRUs, such as circuit boards or circuit elements, acquire a coating of contaminants which, in some cases are conductive and in any case constitute a barrier for heat dissipation. The operating life of electronic circuits is correlated to the temperature at which they operate. When dirty or contaminated air is circulated through the LRU boxes, failures of the circuitry occur prematurely, and such failures, needless to say, may jeopardize the safety of the aircraft and its passengers, as well as being very costly for the aircraft operator.

Replacing an LRU involves more than simply unplugging one unit and inserting a substitute unit into the avionic tray. If the connection between the multiple pin, plug and socket connectors on the LRU and on the avionic tray are separated, government and avionic maintenance industry rules require checking the integrity and function of every one of the plurality of circuits that are made by the multiple line connectors before the replacement process can be accepted, and the aircraft can be restored to operation. It will be evident, therefore, that it would be highly desirable to have a coolant air filter assembly associated with each LRU that not only provides for filtering the input air of the LRU and assures uniform airflow through the LRU, but also allows replacement of the dirty or contaminated filter without requiring that the LRU be disconnected, withdrawn from the avionic tray or otherwise disturbed.

The air filtering system for an LRU described and claimed in the above-cited copending application has achieved the objectives set forth in the preceding paragraph and more. The copending application discloses how to construct a filter assembly that is adapted for exchanging filter elements without requiring withdrawal of the LRU from the avionic tray or otherwise disturbing the connection of the LRU box to the connector on the tray. Moreover, in the filter assembly disclosed in the copending application, the parts are arranged such that a plenum is defined between the bottom of the filter element and the planar top surface of the LRU box to enhance distribution of the air over the top surface and, hence, uniformly over the cross-sectional area of the interior of the LRU box. One possible disadvantage of the previous filter assembly design is that it requires fastening an auxiliary frame structure onto the avionic tray to support the filter assembly from the tray. Adding parts to a conventional avionic tray is not inconvenient in the factory where the frame can be mounted to the avionic tray permanently, but on existing aircraft where LRUs are mounted in conventional fashion on the avionic trays, it is not practical to remove the trays and modify them by adding an auxiliary filter assembly supporting frame.

SUMMARY OF THE INVENTION

The new coolant air filter assembly for LRUs is adapted for being mounted in air flow communication with an LRU and is supported directly on an LRU without requiring joining any filter assembly supporting structure to the avionic tray while still preserving the feature of allowing replacement of the filter element without requiring that the LRU be withdrawn from the avionic tray.

In accordance with the invention, the filter assembly mounts directly on the LRU box and comprises a generally planar base member in which there is an opening that is almost as large as the rectangular top surface of an LRU box. There are gaskets surrounding the opening on the top surface of the base and on the bottom surface. A filter element having a metal frame for retaining a filter pad rests on the top gasket of the base and the bottom gasket bears on the top surface of the LRU box since the opening in the base exposes the multiplicity of coolant air conducting holes in the top surface of the LRU box. A cover member having a corresponding opening fits over the filter element. The cover member is connected to the base by means of a hinge which permits the cover member to be pivoted upwardly to allow removal of the contaminated filter element and replacement of it with a clean one. Latch means are provided for holding the cover to the base. The assembly thus far described is releasably secured to the LRU by means of a harness comprised of a clamping strap and is provided with a cable that wraps around the front end of the LRU and an exposed end of the planar base is attached to the strap. It has a spring interposed in it. The cable exerts a force on the base which has a horizontal component and a vertical component. The vertical component exerts a force on the base which compresses the gasket sufficiently to effect a seal between the base and the top of the LRU box. The horizontal component of force is simply opposed by the clamping trap holding down the base. the cover for the filter element is latched to the base. It is only necessary to unlatch the cover to exchange filter elements but everything else stays in place.

How the foregoing objectives and features of the invention and other more specific features are achieved and implemented will now be described in greater detail in reference to the drawings.

DESCRIPTION OF THE PREFERRED EMBODIMENT

Figure 1:
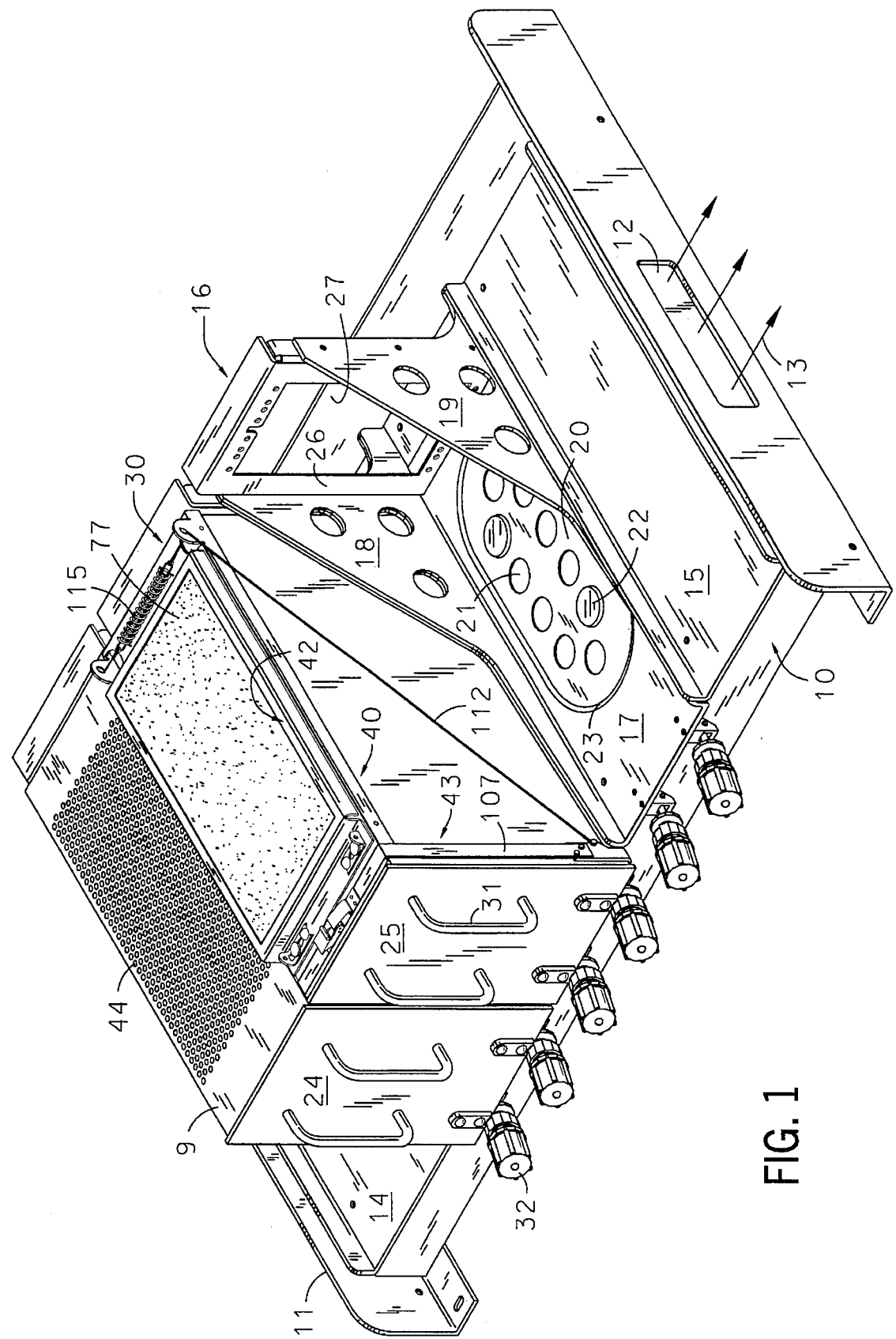
FIG. 1 is a perspective view of an avionic plenum shelf that is supporting two blank cover plates, one empty avionic tray, one avionic tray containing an LRU, and one tray containing an LRU which is provided with the new coolant air filter assembly that is mounted directly on the LRU.

Attention is invited to FIG. 1 which shows a box-like plenum shelf that is generally designated by the numeral 10. The plenum shelf may be mounted in an aircraft on support members such as the one marked 11. Plenum shelf 10 is hollow and it is subject to having a negative pressure developed in it or, in some cases, a positive pressure. In the embodiment depicted in FIG. 1, it is assumed that the interior of the plenum shelf 10 has air at negative or below ambient pressure developed in it. The shelf has at least one end opening 12 through which air may be withdrawn to cause air exiting from the LRU boxes to flow away in the direction of the arrows 13. Those familiar with the art are aware of various means to create suction at opening 12 and a negative pressure in shelf 10. The plenum shelf 10 depicted in FIG. 1 is designed for accommodating a maximum of five trays for LRUs. Where there are no LRU trays, the shelf 10 is closed off at the top with sealing plates 14 and 15 having gasket material, not shown, between the plates and plenum shelf.

In FIG. 1, a typical LRU tray is generally designated by the numeral 16. The tray comprises a base plate 17 which has integral upstanding triangularly-shaped sidewalls 18 and 19 in which there may or may not be included the lightener holes, as shown. The bottom 17 of avionic tray 16 has a recessed plate 20 in which there are a plurality of air metering holes 21 as is typical. Usually, at least some of the metering holes 21 are plugged with removable rubber plugs 22 so that the air flow volume can be controlled to match the amount of coolant air that is required for a particular heat-generating component in an LRU that is supported on tray 16 for having coolant air drawn through it. Coolant air metering plate 20 is supported on a gasket 23 in an opening in the tray bottom 17. The gasket may be of a type that is capable of effecting a seal with surfaces above and beneath it. A similar gasket is shown in U.S. Pat. No. 3,871,937. As will be discussed shortly hereinafter, a line replaceable unit (LRU) box such as the two of them which are generally designated by the numerals 24 and 25 in FIG. 1 have a multiplicity of holes in their bottoms. The bottom can make a sealed connection to the top edge of gasket 23 while the bottom edge of the gasket effects a seal with the metering plate 20 to establish an air flow path from the holes in the bottom of the LRU to the plenum shelf 10. The recessed metering plate 20, of course, is actually supported on gasket 23 as shown in the cited patent.

As is customary, the conventional or standard avionic tray 16 has a rear wall or electrical connector mounting plate 26 in which there is an opening 27. Connector plate 26 is provided for mounting a stationary multiple pin connector such as the one symbolized by the phantom line rectangle 28 in FIG. 3.

The LRU boxes 24 and 25 in FIG. 1 can be pushed into or pulled out of their respective avionic trays by means of a pair of handles on each of them. A typical handle is marked 31. Locking members 32 secure the LRU 24 and 25 in their avionic trays and assure that the electrical connections at the rear of the boxes as viewed in FIG. 1 will be held securely under all conditions. In FIG. 1, the top surface of LRU 24 does not have the new filter assembly mounted to it as yet. A majority of the top flat surface area 9 of LRU 24 has an array of small holes 44 which constitute the coolant air inlet holes for the LRU. In some LRU models, a majority of the top surface area 9 is not covered with holes but, instead, there is only a single file rectangular pattern of holes inside of an imperforate margin having a width of about one centimeter.

Figure 7:
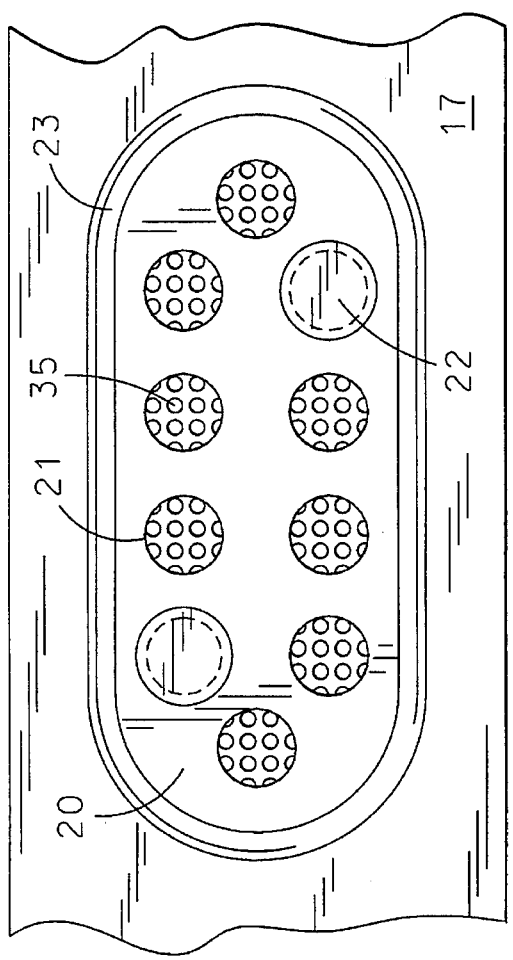
FIG. 7 is a bottom view of the avionic tray depicted in FIG. 1 in solid lines and in FIG. 3 in phantom lines, looking in the direction of the arrows 7—7 in FIG. 3.
Figure 6:
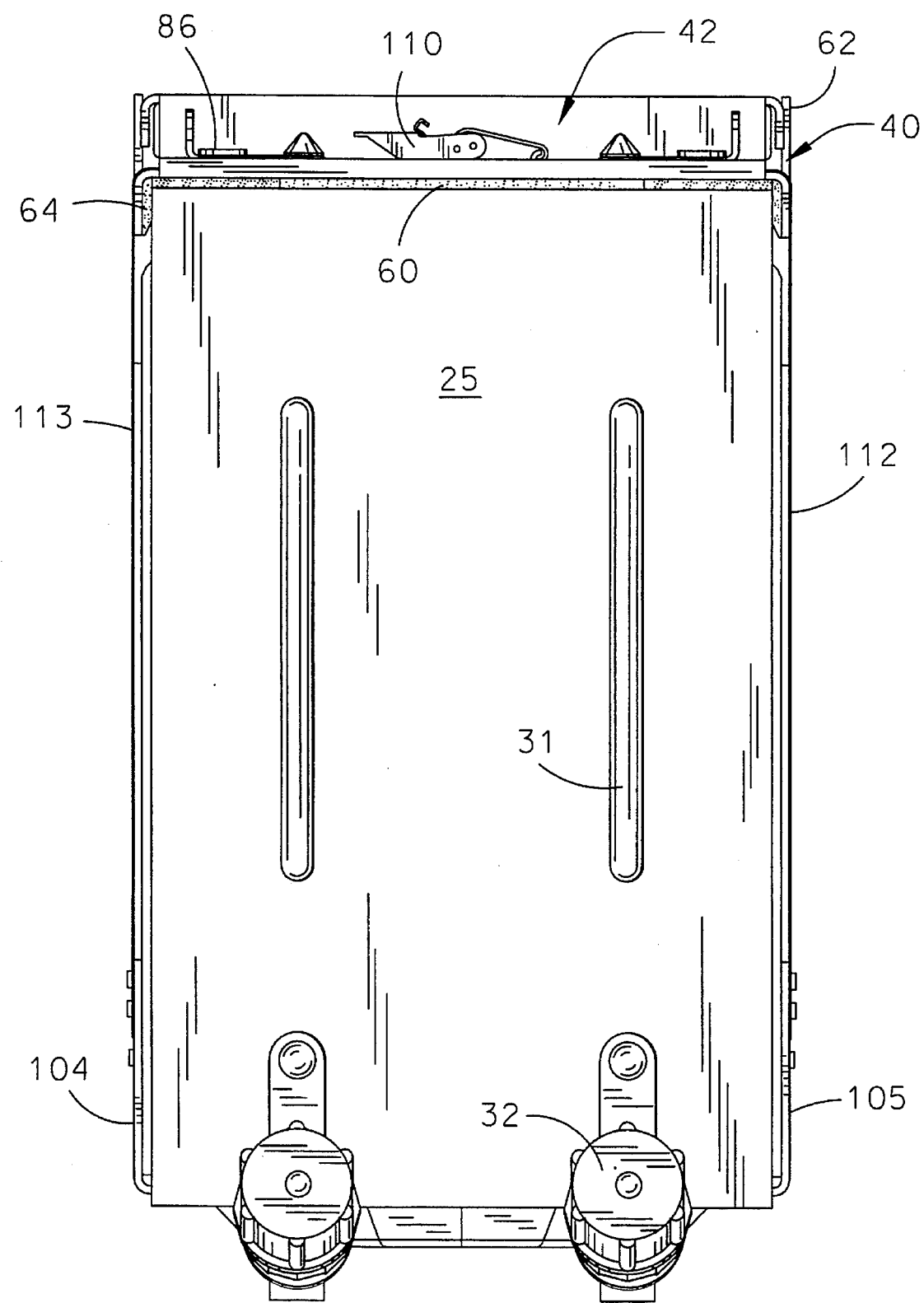
FIG. 6 is a front elevational view of an LRU inserted in an avionic tray with the new filter assembly installed on top of the LRU, looking in the direction of the arrows 6—6 in FIG. 3.

FIG. 7 is a view of part of the bottom 17 of a typical avionic tray as seen from beneath the avionic tray. This FIGURE exhibits the metering plate 20 and the air flow metering holes 21 which were previously mentioned in reference to FIG. 1. When there is an LRU resting on the top surface of gasket 23, one may see that the bottom surface of the LRU box is also provided with an array of small holes 35 which constitute the outlet holes for coolant air which has passed through the LRU box already and is on its way to the negative pressure zone in plenum shelf 10. The bottom air outlet holes may also be arranged in a single file rectangular pattern.

Figure 2:
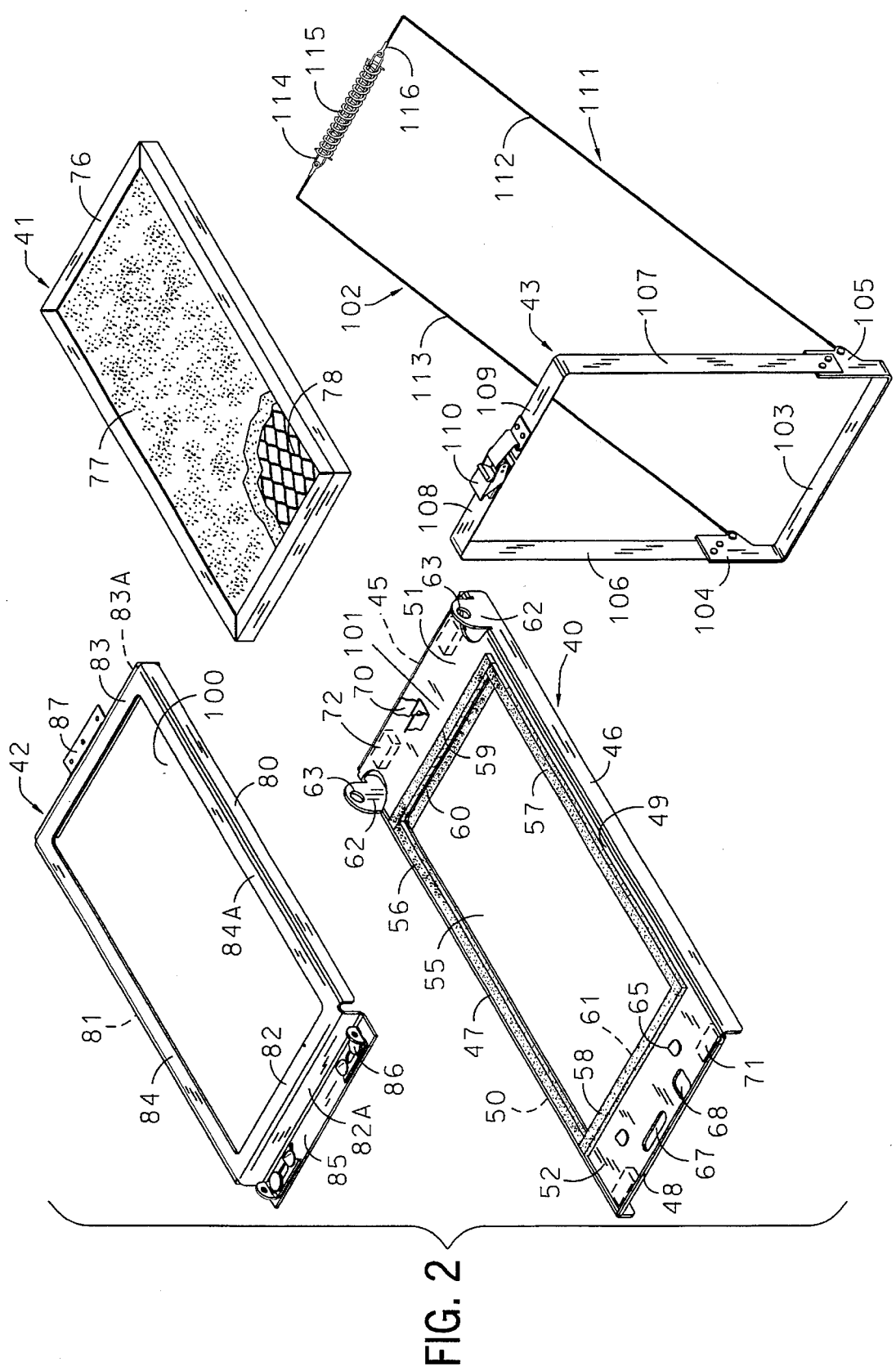
FIG. 2 is a perspective exploded view of the four main components of the new filter assembly, namely, the base, a cover plate, a filter element and a harness assembly.
Figure 3:
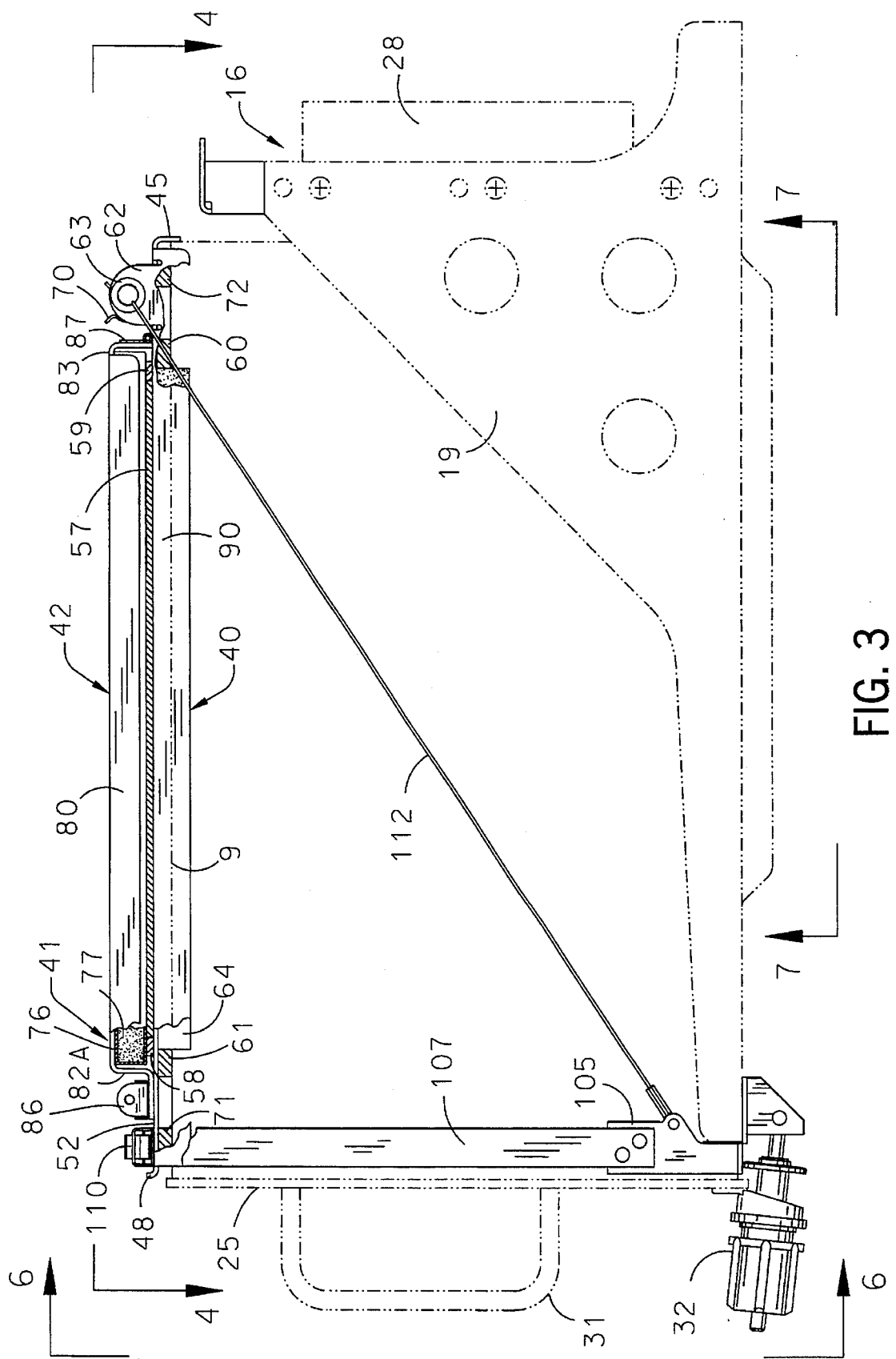
FIG. 3 is a side-elevational view, partly in section, of a standard avionic tray showing an LRU and the electrical connectors in phantom lines, and showing the new coolant air filter assembly interfacing with the top surface of the LRU.
Figure 5:
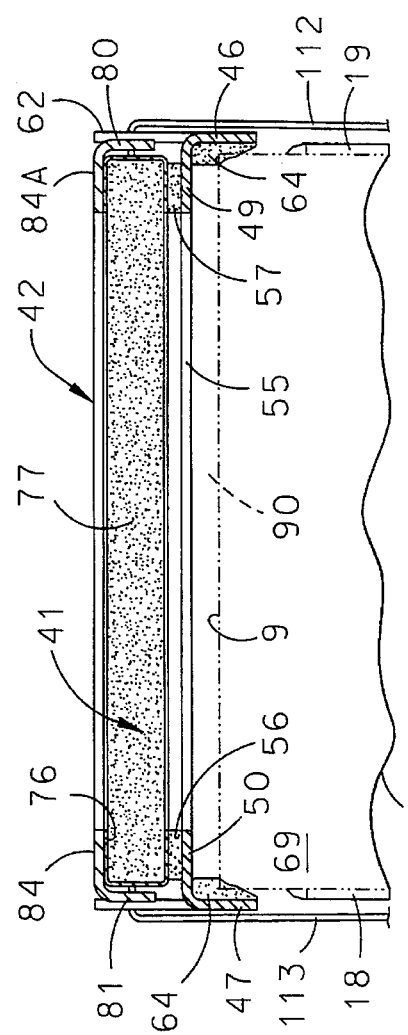
FIG. 5 is a partial vertical cross-sectional view of the filter assembly taken on a line corresponding with 5—5 in FIG. 4.

In FIG. 1, a new coolant air filter assembly is mounted to LRU box 25 and is designated generally by the numeral 30. In FIG. 2, one may see that the coolant air filter assembly 30 is comprised of four major components; namely, base 40, filter element 41, cover member 42 and a harness assembly 43. The base 40 is a unitary frame comprised of end walls 45 and 48 and sidewalls 46 and 47. End wall 45 depends downwardly from the plane of surface area 51 of the base frame 40 which will hereafter be called a base for the sake of brevity. The opposite end area 52 of the base terminates in an edge 48 which has a slight upward curve and constitutes a low wall that is more readily visible in FIG. 3. Flat margin rims 49 and 50 (under gasket 56) of base 40 in FIG. 2 extend inwardly of the top edge of sidewalls 46 and 47 of base 42 and in conjunction with the end areas 51 and 52 define a large rectangular air inlet opening 55 in the base. Margin rims portions 49 and 50 are also visible in FIG. 5. As can be seen in FIGS. 2 and 5, the sidewall margin rims 49 and 50 of base 10 have gasket portions 56 and 57 on them. The end rims 51 and 52 have gasket portions 58 and 59 on them so that the opening 55 is completely surrounded by a gasket on the top surface of base 40. In FIG. 2, one may see that on the underside of the base at the end of the rectangular opening 55, there are gasket portions 60 and 61, the latter of which is not clearly visible in FIG. 2, but it is similar to gasket 60. As one may see particularly well in FIG. 5, that the insides of the depending sidewalls 46 and 47 of base member 40 are provided with similar gasket portions 64. It will be evident from FIGS. 1, 3 and 5 that base member 40, depicted in FIG. 2, fits onto the top of typical LRU box 25. Gaskets 64 effect a seal between base 40 and the corners of the top surface 9 of the LRU box containing the array of air inlet holes 44. Because of the ends of the opening 55 in the base also being in sealing relationship with the top surface 9 of the LRU through the agency of gaskets 60 and 61, these two gaskets in conjunction with gaskets 64 define a coolant air infeed plenum 90 for assuring that the incoming coolant air will spread out over the array of small holes 44 in the top surface 9 of the LRU box, so that there will be a uniform distribution of the coolant air stream through the LRU box. FIGS. 2 and 3 exhibit stops 71 and 72 which limit compression of the gaskets between the LRU box top surface and the base to thereby maintain the desired depth or thickness of the air infeed plenum 90. Typical stops 71 and 72 of the four stops shown may be composed of resilient material and are attached to the bottom of the base with adhesive.

After the base 40 is superimposed sealingly on the top of LRU box 25, the filter element 41, depicted in FIG. 2, is superimposed on the base. The filter element is comprised of a porous, soft filter pad 77 whose edges are captured in a channel frame 76. The filter pad 77 is supported by a grid or screen 78, so it will not distend when it is subjected to the velocity pressure of the coolant air stream. The channel frame 76 bears on the gasket comprised of portions 56, 57, 58 and 59 on the top surface margins of base 40. This assures that any air passing through opening 55 of the base must first have passed through filter pad 77 before it can reach the coolant air inlet holes 44 of the LRU box top surface 9. How the filter element 41 is interfaced with the marginal rims 46 and 50 of the base 40 is exhibited in FIG. 5. By way of example and not limitation, the filter pad 77 may be an open cell foam synthetic resin about 5 mm thick or a reticulated foam synthetic pad about 5 mm thick.

The next major component of the new filter assembly 30 to be described is the cover 42 depicted in the exploded FIG. 2 view. Cover 42 has top margins 84 and 84A and sidewalls 80 and 81 which extend downwardly from the margins. End walls 82A and 83A depend downwardly from marginal rims such as the rims marked 82 and 84. The marginal rims define a rectangular opening 100 that is comparable in size to the opening 55 in the base 40. Typical rims 82, 83, 84 and 84A interface with the frame 76 of filter element 41 when the cover 42 is assembled to the base 40 of the filter assembly as is the case in FIGS. 3–6. Cover 42 is actually connected to base 40 by means of a hinge 57 at the rear end of the cover. One wing of the hinge 87 attaches by spot welding or other suitable means to the cover and the other wing is fastened by spot welding or other means to the base in the region marked 101 in FIG. 2. Thus, after the filter assembly 41, base 40, and cover 42 assembly are installed on an LRU, one may swing cover 42 upwardly by a small amount and insert filter element 41 under the cover. Similarly, when a filter is dirty or contaminated and must be replaced, the cover is unlatched as will be explained and pivoted on hinge 87 to provide for withdrawing the old filter and inserting a clean one.

Figure 4:
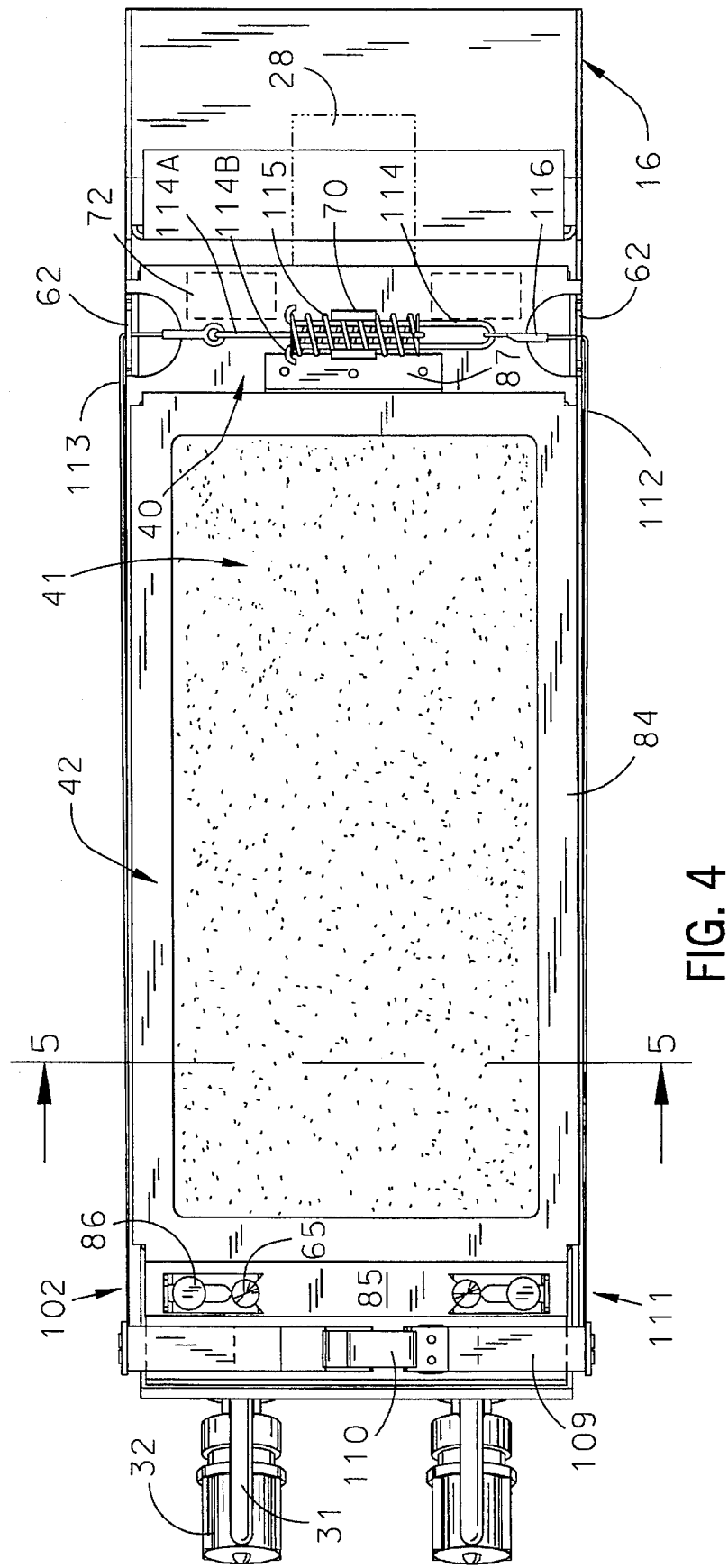
FIG. 4 is a top plan view of the new filter assembly as viewed in the direction of the arrows 4—4 in FIG. 3.

The fourth major component is the filter retainer harness which is generally designated by the numeral 102 in FIG. 2. The harness is a means for clamping the base frame 40 to the LRU and comprises a rigid generally U-shaped bracket member 103. The bracket has two upstanding portions 104 and 105 that are spaced apart by a distance a little greater than the width of a particular LRU. LRUs can have different widths so they need dedicated harnesses. A strap or band loop having two sections 106 and 107 are rivetted or otherwise fastened by any suitable means to upstanding portions 104 and 105 of bracket 103. The strap or band has end portions 108 and 109 extending horizontally towards each other. They are releasably connected by a swivel latch 110. A flexible member in the form of a small diameter cable loop 111 has its ends sections 112 and 113 anchored to upstanding bracket portions 104 and 105. The cable sections are interconnected through the agency of hair pin shaped hooks 114 and 114A and a spring 115 which can be seen more clearly in FIGS. 1 and 4. Referring now to FIG. 4, one may see that hook 114 has reentrant ends 114B that engage one end of spring 115. Hook 114A has similar reentrant ends 114C that engage the opposite end of spring 115. This arrangement, in effect, connects corresponding cable sections 112 and 113 to the spring. Eyelets such as the one marked 116 are used to connect the cable to hooks 114 and 114A. As an alternative to interposing a spring between the ends of cable sections 112 and 113, there could be a spring, not shown, interposed in each of the cable sections 112 and 113 to attain elasticity. Other ways of tensioning the cables could be used, for example, an elastomer could be used instead of a spring or a turnbuckle, not shown, could be used.

As has been mentioned, the hinge 87 permits cover 42 to swing and provide access to the filter element 41 for replacing it without disconnecting or removing the LRU from the avionic tray. Under ordinary operating conditions, the cover 42 must be secured in filter element holding position. For this purpose, as can be seen in FIGS. 2 and 4 especially well, the cover 42 is provided with a flange or lip 85 that bends outwardly from the front end wall 82A of the cover. A number of cover locking devices, such as the slotted latch marked 86, for example, are fastened slidably to flange 85. Latches 86 slide under the heads of headed studs 65 that are fixed to base 40 to lock cover 42 to the base. The cover cannot be swung on the hinge away from base 40 without releasing the locking device 86.

FIG. 3 illustrates particularly well how the harness 102 clamps and retains the filter assembly on the top surface 9 of an LRU box 25. Before installing the harness 102 on LRU box 25, the cable sections 112 and 113 are preassembled to base 40 using the spring 115 which is tentatively held to the base by means of a clip 70 that is fixed to the base and in which the spring 115 nests. This can be seen in FIGS. 2 and 4. Hence, the base together with harness 102 is loosely mounted to the LRU box 25 in the first step of clamping the filter assembly on the LRU box. As shown in FIGS. 1 and 3, the clamping strap is, then, installed on the front end of the LRU box with the latch 106 unlatched at first and then latched as shown to secure the band clamp to the front end of the LRU 25. Because cable sections 112 and its counterpart 113 are placed under tension by spring 115, horizontal and vertical components of force are developed by the cable. The horizontal component of force cannot shift the filter assembly from the LRU since the cover is attached to the base by means of hinge 87 and the base is clamped to the LRU box 25 by the harness 102. The upstanding sides 104 and 105 of rigid bracket 103 stop against the ends of the LRU tray side walls 19 as can be seen in FIG. 3. This not only counters the horizontal component of force induced in the cables 112 and 113, but it also aids the installer of the harness in positioning the clamping band.

During routine maintenance of the airplane, filter assemblies whose filter pad 77 may have become dirty and partially clogged are replaced. This is a simple operation involving releasing cover latches 86, swinging the cover 42 on hinge 87 only a small amount to permit grasping the filter pad frame 76, withdrawing filter, inserting a clean one, and resetting cover latches 86. Meanwhile, the base 40 and the attached cover 42 remain secured to the LRU box 25 by the harness which does not need to be disturbed. More importantly, the LRU box does not have to be disturbed.

If an LRU must be removed from an avionic tray, locks 32 are released and the LRU is slid out of the tray with the filter assembly carried on it. The filter assembly could then be installed on a replacement LRU which is easy to do. Only latch 110 on the strap or band loop has to be manipulated to release the harness from one LRU and use it to fasten the filter assembly to another.

In summary, a filter assembly for the coolant air drawn through an avionic line replaceable unit has been provided which is distinguished by being mountable directly on the LRU without requiring any modification of the avionic tray on which the unit is installed. The assembly provides a plenum between the bottom of the filter pad and the top surface of the LRU box to assure that filtered infeed coolant air distributed uniformly over the array of air inlet holes in the top surface of the LRU box. The area and shape of the filter assembly matches the area and shape of the array of air inlet holes so impingement of the infeed air on imperforate zones on the LRU top surface is minimized and, hence, turbulence is reduced. Securing the filter assembly to the LRU box with a harness that simply requires fitting a pre-shaped band on the LRU and setting a latch in the band provides for easy initial installation of the filter assembly and easy reuse of the filter assembly and harness on another LRU.

We claim:

1. A coolant air filter assembly for an avionic line replaceable unit having opposite side walls and end walls and top and bottom surfaces in which there are air inlet and outlet holes surrounded by imperforate margins, the LRU box adapted for mounting in an avionic tray for coupling the air outlet holes in the bottom surface in air flow communication with a negative pressure plenum, the filter assembly comprising:

a base frame having margins defining an opening, the margins having upper and lower surfaces to provide for superimposing said lower surface sealingly to said top surface of an LRU box, a filter element superimposed on the upper surface of the margins of the base frame and covering said opening in the base frame over said array of holes in said top surface of an LRU box, a cover connected to said base frame for pivoting between opened and closed positions and having margins defining an opening, the margins arranged for holding down the filter element sealingly to said margins of the base frame when said cover is in closed position with the opening in the cover coincident with said filter element, clamping means constructed and arranged for clamping said base frame to an LRU, and latch means operative to latch the cover to the base frame and to release the cover for pivoting to provide access to the filter element.

2. The filter assembly according to claim 1 wherein said clamping means comprises:

a device including band sections extending about the perimeter of an LRU box adjacent one of said end walls of the LRU box, the band sections having end portions overlying a portion of said base frame and a latch device for joining the end portions to tighten said band and thereby clamp said portion of the base frame to said top surface of the LRU box, a cable assembly comprised of cable sections having corresponding one ends interconnected with said band sections, respectively, at the regions of said side walls proximate to said bottom surface of the LRU box, a spring element interconnecting corresponding ends of said cable sections opposite of said one ends, cable engaging elements fixed, respectively, to said base frame adjacent and proximate to said top surface, to said side walls of the LRU and to an end wall of the LRU opposite of said one end wall, the said cable sections extending diagonally of said side walls of the LRU box from where they are interconnected with said bands to said cable engaging elements and over a portion of said base frame where the cable sections are joined by said spring element, said spring element inducing tension force in the diagonal cable sections which force has a force component directed for clamping said base frame to the LRU box.

3. The filter assembly according to claim 1 wherein said clamping means is a harness comprising:

a band wrapped to the perimeter of said LRU box adjacent one end wall of the LRU box, said band capturing a portion of said base frame between the band and said top surface of the LRU box to clamp said base frame at one place to the LRU box, and tensioned elongated members having corresponding ends interconnected with said band at the side walls of the LRU box and proximate to both of sides walls of the LRU box and proximate to both of said one end wall and said bottom surface of the LRU box, said elongated members extending diagonally along the sidewalls of the LRU box and over a portion of said base frame that is interfaced with said top surface of the LRU box adjacent the end wall of the LRU box opposite of said one end wall, and means for retaining said elongated members where they pass over said portion of the base frame, and means for imparting a tensile force in said elongated members where the force is directed to have a force component effective to clamp said base frame to said LRU box.

4. The filter assembly according to any one of claims 1, 2, or 3 including:

a compressible gasket interposed between said lower surface of the margins of the base frame and said imperforate margins of said top surface of the LRU box, stops interposed between the base frame and said top surface of the LRU box for limiting compression of the gasket when the base frame is clamped to the LRU box, a gasket interposed between said upper surface of the margins defining said opening in the base frame and said filter element, the thickness of the gaskets and stops defining the thickness of a plenum between the filter element and the top surface of the LRU box to provide for more uniform distribution of the coolant air over said air inlet holes in the top surface of the LRU box.

* * * * *